(12) United States Patent
Johnson

(10) Patent No.: US 11,881,819 B2
(45) Date of Patent: Jan. 23, 2024

(54) AMPLIFIER ASSEMBLY AND METHOD OF AMPLIFICATION PARTICULARLY FOR PORTABLE DEVICE

(71) Applicant: Helm Audio Limited, Wan Chai (CN)

(72) Inventor: Eric Johnson, Wan Chai (HK)

(73) Assignee: Helm Audio Limited, Hong Kong (CN)

( * ) Notice: Subject to any disclaimer, the term of this patent is extended or adjusted under 35 U.S.C. 154(b) by 242 days.

(21) Appl. No.: 17/611,485

(22) PCT Filed: May 15, 2020

(86) PCT No.: PCT/GB2020/051194
§ 371 (c)(1),
(2) Date: Nov. 15, 2021

(87) PCT Pub. No.: WO2020/229839
PCT Pub. Date: Nov. 19, 2020

(65) Prior Publication Data
US 2022/0247363 A1    Aug. 4, 2022

(30) Foreign Application Priority Data
May 15, 2019    (GB) .................................... 1906861

(51) Int. Cl.
*H03F 3/187*    (2006.01)
*H04R 5/033*    (2006.01)
(Continued)

(52) U.S. Cl.
CPC ............. *H03F 3/187* (2013.01); *H03F 3/211* (2013.01); *H03F 3/45475* (2013.01); *H04R 3/00* (2013.01);
(Continued)

(58) Field of Classification Search
CPC ...... H03F 3/187; H03F 3/211; H03F 3/45475; H03F 2200/03; H03F 2203/45138;
(Continued)

(56) References Cited

U.S. PATENT DOCUMENTS

2005/0058303 A1   3/2005   Martin et al.
2017/0180862 A1   6/2017   Strasberg

FOREIGN PATENT DOCUMENTS

GB       2 445 007 A        6/2008
JP       2014175838 A   *   9/2014
WO      2012/024775 A1      3/2012

OTHER PUBLICATIONS

English machine translation of JP 2014-175838 (Otake et al.; Acoustic Device, Method for Controlling Acoustic Device, and Program; published Sep. 2014) (Year: 2014).*

(Continued)

*Primary Examiner* — Mark Fischer
(74) *Attorney, Agent, or Firm* — GREENBERG TRAURIG, LLP

(57) ABSTRACT

A sound system includes a sound source having an analogue audio signal output and a sound volume control; signal amplifier apparatus (10) comprising an analogue signal input (12) configured to be coupled to the analogue audio signal output of the sound source, an analogue signal output (18) and an amplifier module (62) coupled between the signal input and the signal output. The amplifier module (62) has a fixed amplification gain within a range of 10 to 12 decibels. Control of the audio signal is effected solely by the sound volume control of the sound source. The amplifier module (64) also provides a fixed gain bass boost of 6 decibels. The system provides linear amplification and allows a user to reduce the volume of the sound source, which significantly reduces signal distortion. Volume control is at the sound (Continued)

source and not at the amplifier module, which optimises amplification quality and reduces the power requirement of the amplifier apparatus (10).

20 Claims, 10 Drawing Sheets

(51) Int. Cl.
    *H03F 3/21*        (2006.01)
    *H03F 3/45*        (2006.01)
    *H04R 3/00*       (2006.01)
    *H03G 5/02*        (2006.01)
    *H04R 1/10*        (2006.01)

(52) U.S. Cl.
    CPC ......... *H04R 5/033* (2013.01); *H03F 2200/03* (2013.01); *H03F 2203/45138* (2013.01); *H03G 5/025* (2013.01); *H04R 1/1041* (2013.01); *H04R 2430/01* (2013.01)

(58) Field of Classification Search
    CPC ........ H04R 3/00; H04R 5/033; H04R 1/1041; H04R 2430/01; H03G 5/025
    See application file for complete search history.

(56) References Cited

OTHER PUBLICATIONS

International Search Report and Written Opinion from International Application No. PCT/GB2020/051194 dated Aug. 7, 2020.

* cited by examiner

AMPLIFIER ASSEMBLY AND METHOD OF AMPLIFICATION PARTICULARLY FOR PORTABLE DEVICE

CROSS-REFERENCE TO RELATED APPLICATIONS

This application is a national phase filing under 35 USC 371 of International Application No. PCT/GB2020/051194, filed on May 15, 2020, which claims the benefit of British Patent Application No. 1906861.8, filed May 15, 2019, the contents of which are incorporated herein in their entirety for all purposes.

TECHNICAL FIELD

The present invention relates to an amplifier assembly and a method of amplification of audio signals, particularly for use as an adjunct with portable devices such as mobile telephones, portable music devices, tablet and laptop computers, and the like.

BACKGROUND ART

The advent of ever more sophisticated portable electronic devices, such as mobile telephones and table computers, has resulted in these devices being used for a multitude of applications, including the listening of music, films and so on. Previously, dedicated music players with digital amplifiers were used to store and play music.

In part as a result of the large number and variety of components included for performing a variety of complex functions, as well as size constraints, mobile telephones and often tablet computers are usually equipped with poor quality amplifiers. While these amplifiers perform reasonably well for speech, they are inadequate for playing high quality music, suffering from high signal distortion and lack of dynamic range particularly at higher volumes. The use of high quality headphones with large drivers also results in suboptimum sound quality as a consequence of the poor quality input signal.

There are in the marketplace portable digital amplifiers, some equipped with bass boost. While these portable amplifiers are able to alleviate some shortcomings of devices, they do not address all their problems, and also constitute an additional relatively bulky device that the user needs to handle. An example of a commercially available external amplifier has dimensions in the region of 13 centimetres in height and 8 centimetres in width, as well as significant weight. Such a device needs its own provisions for handling. A typical headphone user would therefore need to carry a mobile telephone, the amplifier, a jumper cable to connect the telephone to the amplifier, a standard audio cable, and headphones. This can be inconvenient and difficult.

SUMMARY OF THE INVENTION

The present invention seeks to provide improved audio signals from an electronic device, such as but not limited to a mobile telephone, a portable music device, a tablet or laptop computer, and so on.

According to an aspect of the present invention, there is provided signal amplifier apparatus comprising an analogue signal input, an analogue signal output and an amplifier module coupled between the signal input and the signal output, wherein the amplifier module has a fixed linear amplification gain in a range of 10 to 12 decibels and wherein the amplifier module is configurable to provide a fixed gain bass boost additive to the fixed amplification gain and wherein the bass boost is generally uniform over a predetermined range of bass frequencies; and wherein the amplification gain and/or bass boost are configurable to be on or off and otherwise not adjustable.

In the preferred embodiment, the amplifier module provides a fixed gain of 12 decibels.

The fixed bass boost is preferably of 6 decibels.

Advantageously, the bass boost of amplifier module is configured to have a Q at around 100 Hz.

Preferably, the amplifier module provides a generally uniform bass boost between 60 and 100 Hz, and/or a bass boost up to a frequency of no more than 300 Hz, and/or a bass boost down to a frequency of no less than 10 Hz or 20 Hz.

The apparatus may be incorporated into an audio cable having a first connector for coupling to a sound source and a second connector for coupling to headphones or earphones. At least one of the first and second connectors may be a 3.5 mm connector.

According to another aspect of the present invention, there is provided a sound system including a sound source having an analogue audio signal output and a sound volume control; signal amplifier apparatus comprising an analogue signal input configured to be coupled to the analogue audio signal output of the sound source, an analogue signal output and an amplifier module coupled between the signal input and the signal output, wherein the amplifier module has a fixed linear amplification gain in a range of 10 to 12 decibels and wherein the amplifier module is configurable to provide a fixed gain bass boost additive to the fixed amplification gain and wherein the bass boost is generally uniform over a predetermined range of bass frequencies; wherein the amplification gain and/or bass boost are configurable to be on or off and otherwise not adjustable; and wherein control of the audio signal is effected solely by the sound volume control of the sound source.

Advantageously, the amplifier module is configured to have bass boost with a soft (wide) Q around 100 Hz, a steeper roll off on the top end so as not to provide boost above 300 Hz and a gentler roll off on the lower end with the same or almost as much boost at 60 Hz that at 100 Hz, tapering gradually down to 10 Hz (or 20 Hz) as a lowermost amplification limit. This configuration allows the amplifier to maintain the mid and high end sound curve while only affecting the bass frequencies.

Advantageously, the apparatus provides linear amplification.

The preferred embodiments allow the provision of maximum amplification for music with little or minimal distortion and can solve the problem of mobile devices distorting the signal at high volume levels. Mobile devices are designed with very inefficient amplification to save cost and space. The apparatus and method taught herein allow the use of a mobile device in a volume range where distortion is minimal, rather than pushing the mobile amplifier to the limits of its design, which results in very high distortion. As a consequence, the preferred embodiments not only provide normal distribution with an efficient linear amplifier, they can also reduce distortion by reducing inefficient mobile device amplification to significantly lower levels than currently, at which there is a marked reduction in signal distortion. Moreover, using of volume controls at the mobile device these can be as digital changes, which reduces the distortion often experienced in prior art devices with analogue amplification.

The apparatus is particularly advantageous for headphones that have a flat sound curve, although it can work well with all headphones and is also able to provide for bigger bass sound profiles preferred by many listeners.

In practical tests, it has been established that the bass boost function works extremely well.

The applicant has also discovered that the system provides another significant benefit in amplifying a sound signal by means of reducing the source (mobile telephone) volume, namely that distortion coming from the source is reduced and because the amplification is so clean, the sound produced at the headphones has a spatial effect. Specifically, the sound stage is increased and it can create the impression of surround sound. This is an unexpected result. The improved sound signal is particularly advantageous when listening to movies and games, creating a significantly new experience. Tests have identified in particular that the amplifier provides a cleaner, that is less distorted, sound allowing the user to increase the volume at the headphones without fatigue, abrasion or noise, which can also more easily resolve nuances such as echo, reverb, and crowd noise baked into a sound recording. Those cues might be perceived as spatial aspects and a wider sound stage.

In a practical implementation, the apparatus is incorporated into an audio cable having a first connector for coupling to a sound source and a second connector for coupling to headphones or earphones. At least one of the first and second connectors is a 3.5 mm connector. With the apparatus is incorporated into an audio cable, the cable is much easier to handle and can be used on the go. The preferred implementations are light enough to not have to use an extra hand to carry and can be operated by a single hand.

Preferably, the apparatus includes an incorporated battery, this advantageously being a rechargeable battery. Practical embodiments may use a small lithium-ion 150 mAh battery, more preferably a small lithium-ion 220 mAh battery, with an optimized battery charging circuit designed to reduce charging time with industry required circuit protection for shorting and thermal issues. Advantageously, the apparatus includes a charging port, which may be in the form of a USB-C connector.

The preferred embodiments, therefore, provide an in-line amplifier (all in one cable) able to deliver maximum volume, improved sound quality and bass enhancement on any headphone for a mobile device.

In a preferred embodiment, the apparatus includes a status indicator unit, advantageously providing a status indication relating to one of more of: (i) whether the amplifier is active, (ii) whether the bass boost is active, and (iii) whether the battery is being charged and/or its state of charge. The status indicator unit may be a 3-way LED.

The apparatus advantageously includes a control input having one or more of the following control options: (i) OFF, in which an input signal is passed to the signal output without any modification, (ii) boost ON which provides optimally 12 decibels fixed gain and (ii) optionally, bass boost at a fixed gain of 6 decibels (additive gain).

Volume control and other signal controls are effected by the electronic device, for example the mobile telephone, and these will typically include volume up, volume down, pause and play functions. These functions may be operated through the control unit on the amplifier apparatus, treated as inputs only that are sent to the audio device through the attached cable to change the volume and play controls of the audio device itself.

According to another aspect of the present invention, there is provided a method of amplifying a sound signal from an electronic apparatus by means of an amplifier module in use connected to the electronic apparatus, providing for a fixed linear amplification gain by the amplifier module, wherein the fixed gain is within a range of 10 to 12 decibel, providing for a fixed gain bass boost additive to the fixed amplification gain, wherein the bass boost is generally uniform over a predetermined range of bass frequencies; and providing for the amplification gain and/or bass boost to be on or off and otherwise not adjustable.

The method preferably includes providing at least one of:
a fixed bass boost of 6 decibels;
bass boost having a Q at around 100 Hz;
bass boost that is substantially uniform between 60 Hz and 100 Hz.;
bass boost up to a frequency of no more than 300 Hz;
bass boosted down to a frequency of no less than 10 Hz or 20 Hz.

The system can have any of the features of the amplifier apparatus taught herein.

Other features, aspects and advantages of the teachings herein will become apparent to the skilled person from the specific description that follows.

BRIEF DESCRIPTION OF THE DRAWINGS

Embodiments of the present invention are described below, by way of example only, with reference to the accompanying drawings, in which.

DESCRIPTION OF THE PREFERRED EMBODIMENTS

The preferred implementations of the invention are in the form of an in-line amplifier or boost device designed to be connected between the output of an electronic device, such as a mobile telephone or the like, and a pair of headphones. For this purpose, the device preferably has suitable audio connectors, such as standard 3.5 inch plugs. The device preferably has small dimensions of, for example in the region of 60 to 70 millimetres in length, 20 millimetres in width and 15 to 20 millimetres in thickness and a weight of around 20 to 25, preferably 23 grams, excluding the external cables. The device preferably also has an internal rechargeable battery. A device of such dimensions and form is possible as a result of the manner in which the device is designed, particularly its amplification functionality as described in detail below.

Figure 1:
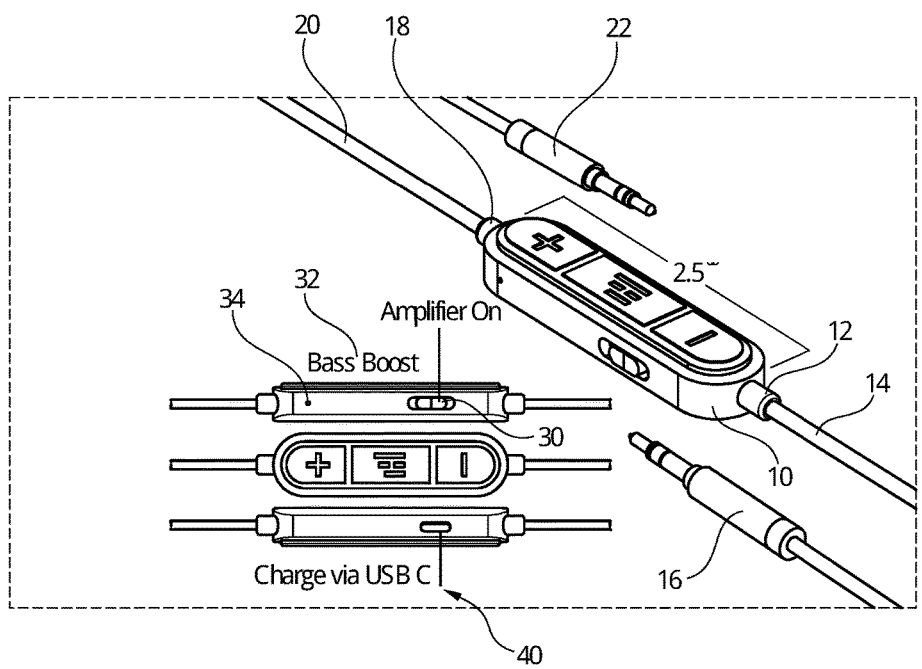
FIG. 1 is a schematic diagram of a sound system according to the teachings herein.
Figure 2:
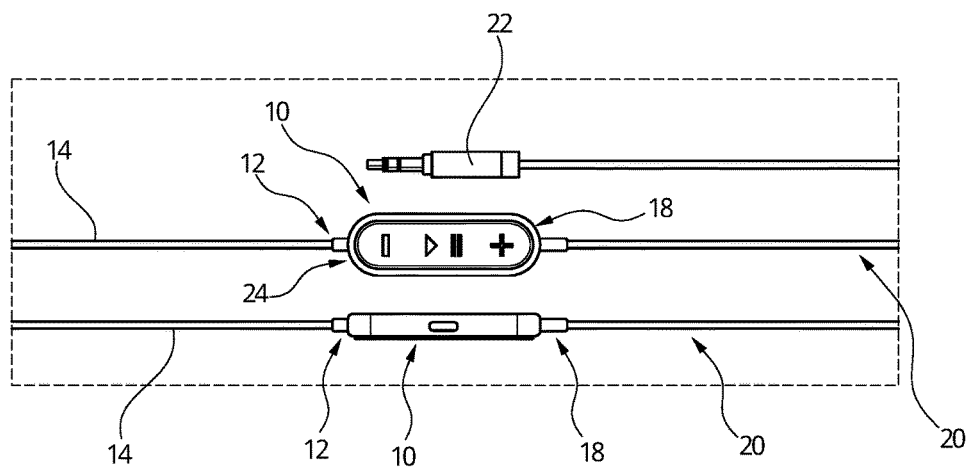
FIG. 2 shows a series of views of the preferred embodiment of amplifier apparatus according to the teachings herein.

Referring first to FIGS. 1 and 2, these show the preferred design of boost amplifier device 10 incorporating the teachings herein. The device 10 is provided with an analogue signal input 12, which includes a cable 14 having attached at its end a connector, in this embodiment a standard 3.5" audio plug 16. There is provided, similarly, an analogue signal output 18 which includes a cable 20 having attached at its end a connector, in this embodiment also a standard 3.5" audio plug 22.

The cables 14, 20 are preferably of low loss material, silver being preferred. In the preferred embodiments, the cables are shielded for better crosstalk performance.

The device 10 has a housing 24, preferably of ergonomic form, in this case a rectangular cuboidal shape with rounded ends and edges. At a top side of the housing 24 there are provided audio control keys 26, typically volume up, volume down, play and pause. The keys 26 do not control the device 10 per se but control the electronic apparatus to which the amplifier device is connected, for instance the mobile telephone. For this purpose, the keys connect through the cable 14 and the connector 22 to a control input module of the electronic device, in known manner, so as to control the sound generation and output from the device. In this example, the keys 26 are configured to control of the telephone volume (up and down) and also to pause/start play.

In addition to the keys 26 on the upper face of the housing 24, the device comprises an amplifier ON/OFF key or switch 30, a bass boost ON/OFF key or switch 32 and a visual indicator, in this embodiment a three-way LED 34. These are preferably disposed in one side wall of the housing 24 as shown in FIG. 1.

At the other side of the housing 24, in this embodiment, there is preferably provided a charge port, in this case a USB-C socket 40. Any suitable power connector can be used.

Figure 3:
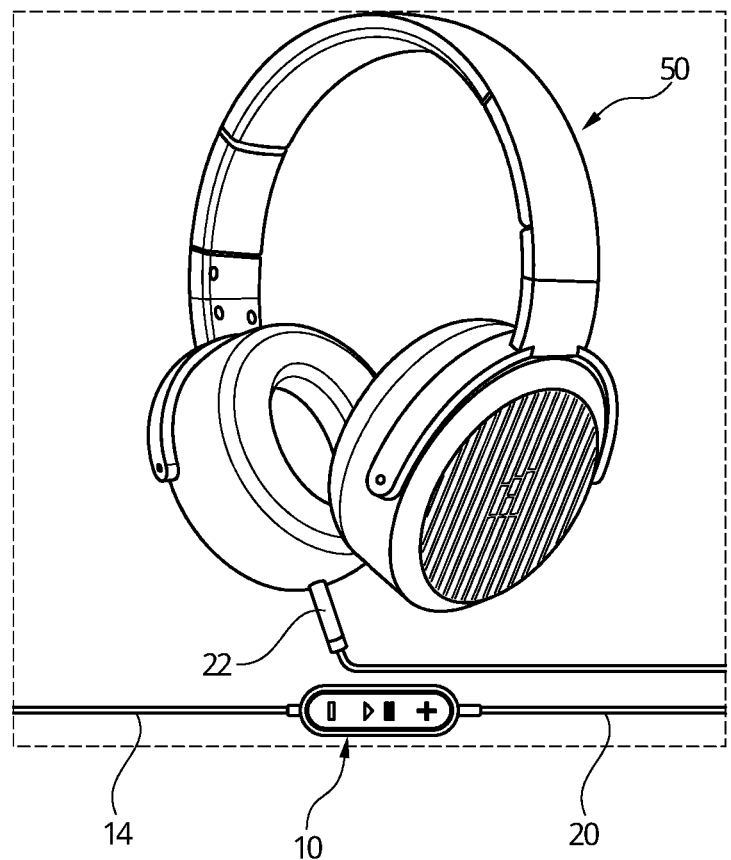
FIG. 3 is a schematic diagram showing the preferred embodiment of amplifier apparatus when connected to a set of headphones.

With reference now to FIG. 3, this shows the amplifier device 10 shown connected to a set of headphones 50 as they would be in practice. As can be seen, the amplifier device 10 lies in-line with the cable from the sound source in an unobtrusive manner. It size and weight, as well as its power requirement, are such that it is not necessary for a user to carry or hold a bulky amplifier device and accessories associated therewith.

It is preferred that the device is designed to meet IPX 4 waterproof standards.

Figure 4:
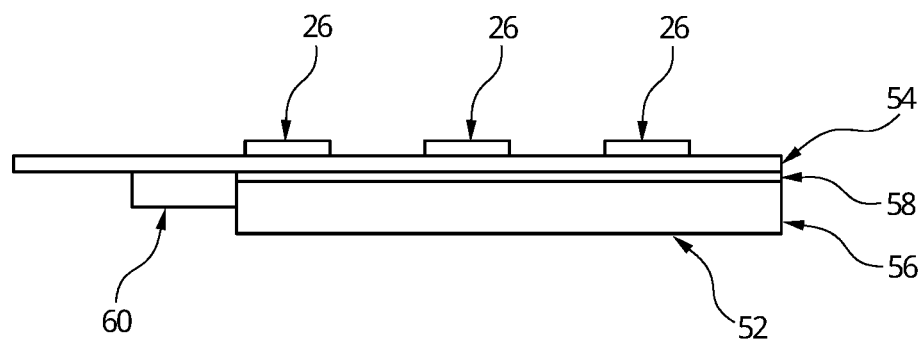
FIG. 4 is a schematic diagram showing a configuration for the preferred embodiment of amplifier apparatus.
Figure 5:
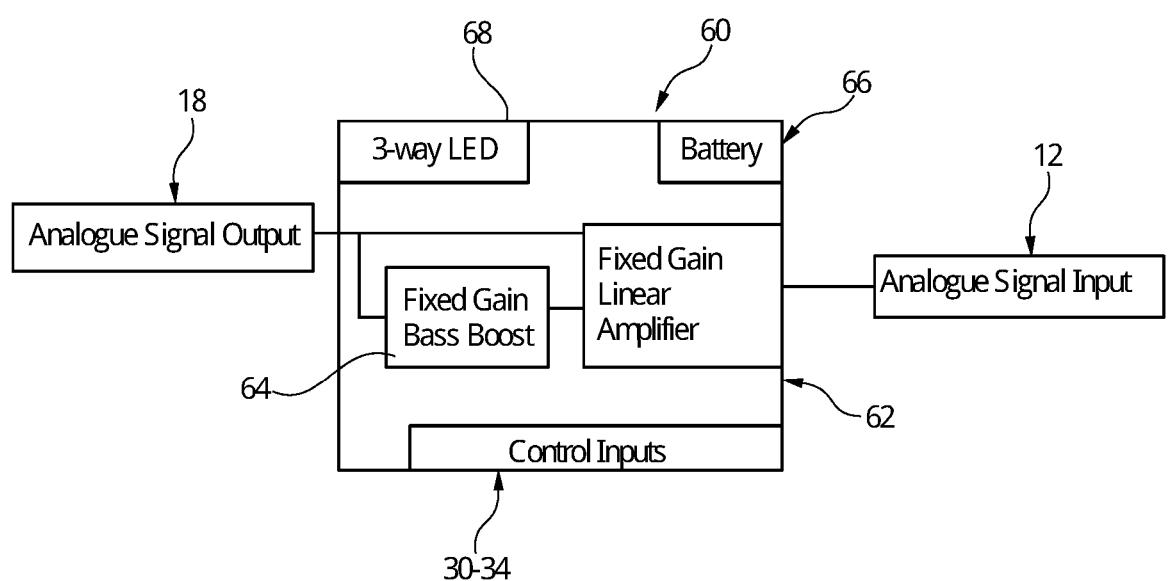
FIG. 5 is a schematic diagram showing the main components of the circuitry of the amplifier apparatus disclosed herein.

FIG. 4 is a schematic view of part of the components of the embodiment of device shown particularly in FIGS. 1 and 2, while FIG. 5 is a block diagram of the main circuit blocks. Referring to FIG. 4 first, the device 10 preferably includes an internal unit 52 having a printed circuit board 54, to which the keys 26 are fitted (and also the switches and LED(s), although not visible in the view of FIG. 4). A battery 56, described in further detail below, is advantageously fixed to a side of the PCB 54 by a layer of glue 58. While the battery 56 need not be attached to the PCB 54, and instead held in position in the housing 24, it is preferred that it is attached, by glue or any other means such as a clip, potting or any other suitable means. The battery wires 60 are coupled to the PCB 54, in known manner, to power the electronic components of the device 10.

Referring now to FIG. 5, this shows in block diagram form the main components of the amplifier circuit of the device 10. These include the analogue signal input 12, typically via the cable 14 and plug 16, and the analogue signal output 18, similarly typically via the cable 20 and plug 22. Both the input 12 and the output 18 connect to the amplifier circuit 60, which includes a fixed gain amplifier module 62, a fixed gain bass boost module 64, as well as the control inputs 30, 32, a battery 66 and the three-way LED indicator 34. The fixed gain amplifier module 62 is either ON or OFF in the preferred embodiment. When OFF it will pass the input signal straight through to the output 18 without any amplification or other intended modification. When ON the module 62 will provide fixed gain amplification across the operative frequency range. The fixed gain bass boost module 64 is also ON or OFF and when ON will add a further fixed bass gain to the amplified signal. Otherwise, the module 64 will not add bass boost.

Since the circuit 60 is analogue based, it has a very low power requirement, enabling longer battery life. Moreover, the use of a linear amplifier 62 provides very low signal distortion, which gives a clean and linear signal over the range of amplification. Utilizing a three-way LED 68 can clearly indicate charging, amp on and boost on. In the preferred embodiment a red LED colour would indicate that the battery 66 is being charged, green would indicate the amplifier module 62 is on, and blue would indicate the bass boost module 64 is on.

The amplifier module 62 provides fixed gain amplification when switched on, in the preferred embodiment of 10 to 12 decibels, most preferably 12 decibels, which has been found to be optimum. The amplifier module is configured to provide a substantially instant 12 decibel gain with substantially zero distortion over its operative frequency range. The bass boost module 64 also preferably provides a fixed gain boost advantageously of 6 decibels, additive to the general signal amplification gain from the module 62. The bass boost is preferably limited to a specific frequency range, as explained in further detail below.

The battery 66 is preferably a small lithium-ion 150 mAh battery, more preferably a small lithium-ion 220 mAh battery, and comprises an optimized battery charging circuit to reduce charging time, with industry required circuit protection for shorting and thermal issues. In practical tests, the device 10 has been found to operate for around eight hours on a single battery charge.

In all embodiments, the incorporated battery preferably provides power for 6 to 8 hours of operation on a single charge.

The amplifier module 62 has been designed to turn on at the fixed amplification with almost no distortion. This allows the device 10 to provide maximum amplification for music with minimal or no effective distortion it solves the problem of mobile devices distorting signals at high volume levels because the mobile device can be set at a lower volume level, as which signal distortion is generally significantly less. The ability not to drive the built-in telephone amplifier so hard allows reduced volume at the device, which is a positive by-product of this control feature. The device therefore not only provides normal distribution with an extremely efficient linear amplifier module 62, but it also reduces distortion caused by normal mechanical adjustment. It also avoids distortion caused by digitalizing the signal.

Figure 6:
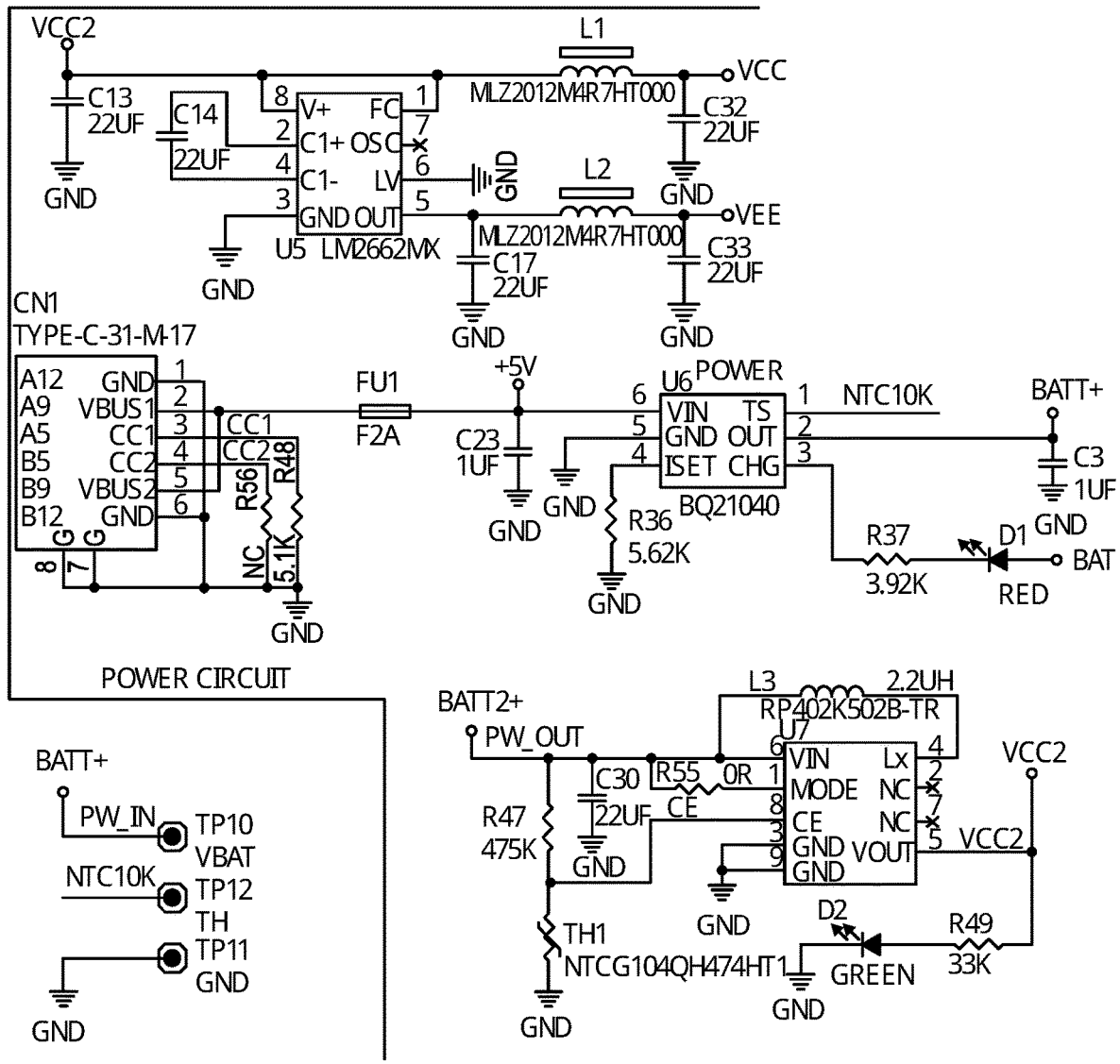
FIG. 6 is a circuit diagram showing a preferred embodiment of battery circuit.

FIG. 6 is a circuit diagram of the preferred embodiment of power circuit having the characteristics taught herein. As the circuit diagram is provided this gives the skilled person all the necessary information with regard to the preferred embodiment and it is therefore considered not necessary to repeat that information textually in the description.

Figure 7:
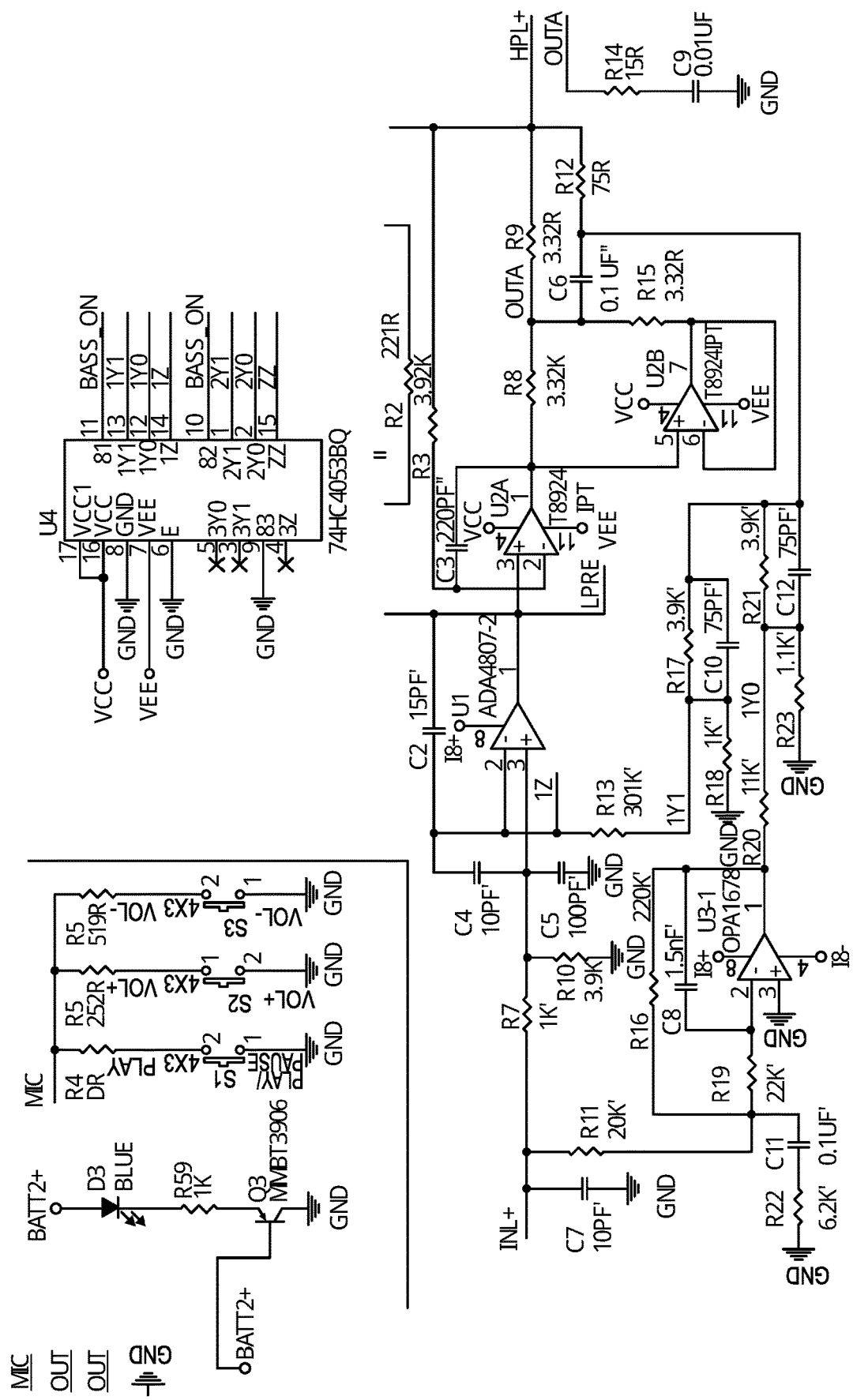
FIG. 7 is a circuit diagram showing a preferred embodiment of boost circuit.
Figure 7:
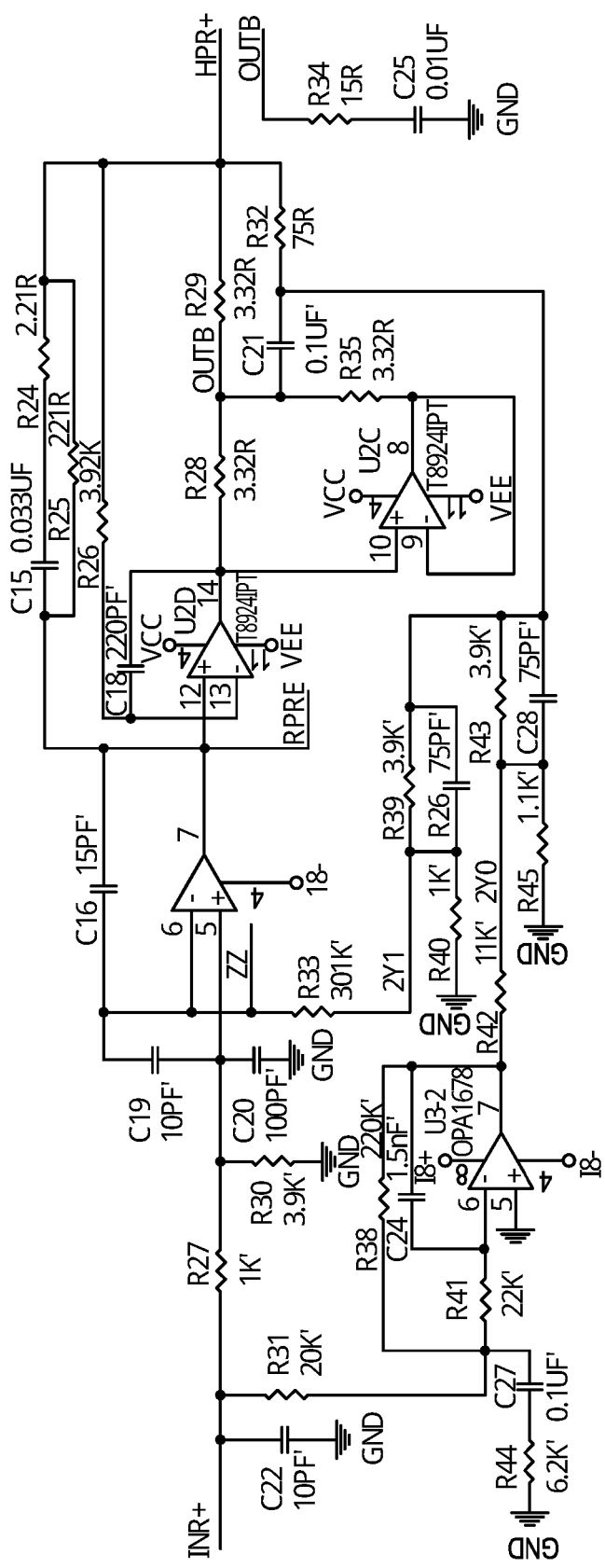
Figure 7:
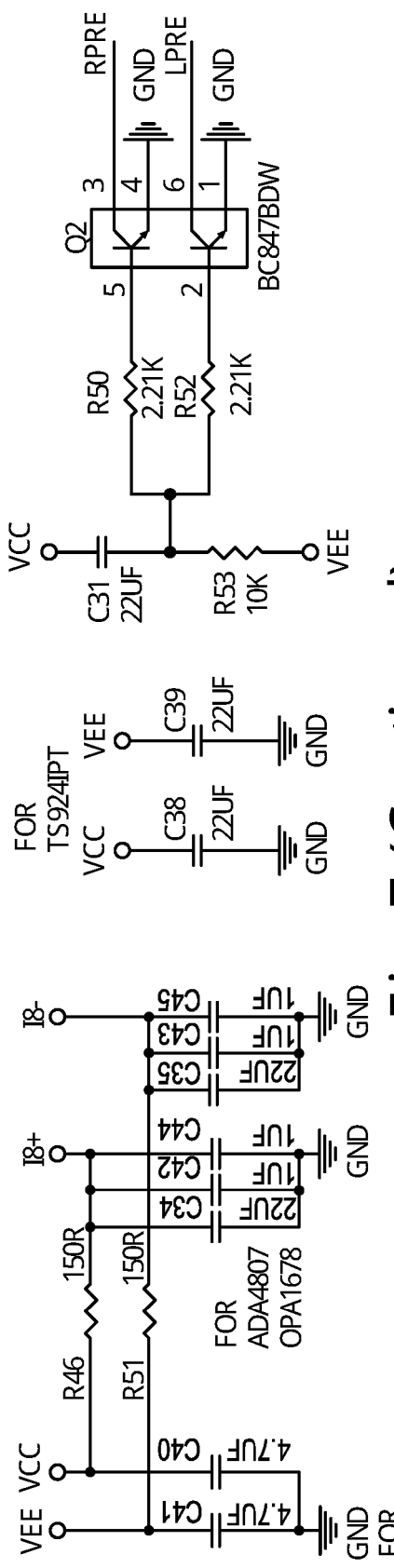

FIG. 7 is a circuit diagram of the preferred embodiment of boost gain circuit having the characteristics taught herein. As the circuit diagram is provided this gives the skilled person all the necessary information with regard to the preferred embodiment and it is therefore considered not necessary to repeat that information textually in the description.

Figure 8:
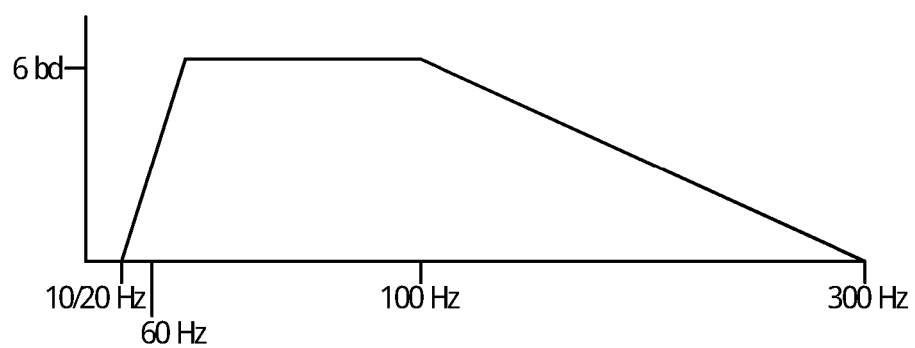
FIG. 8 is a representative bass boost amplification curve of the preferred embodiment of amplifier apparatus disclosed herein.
Figure 9:
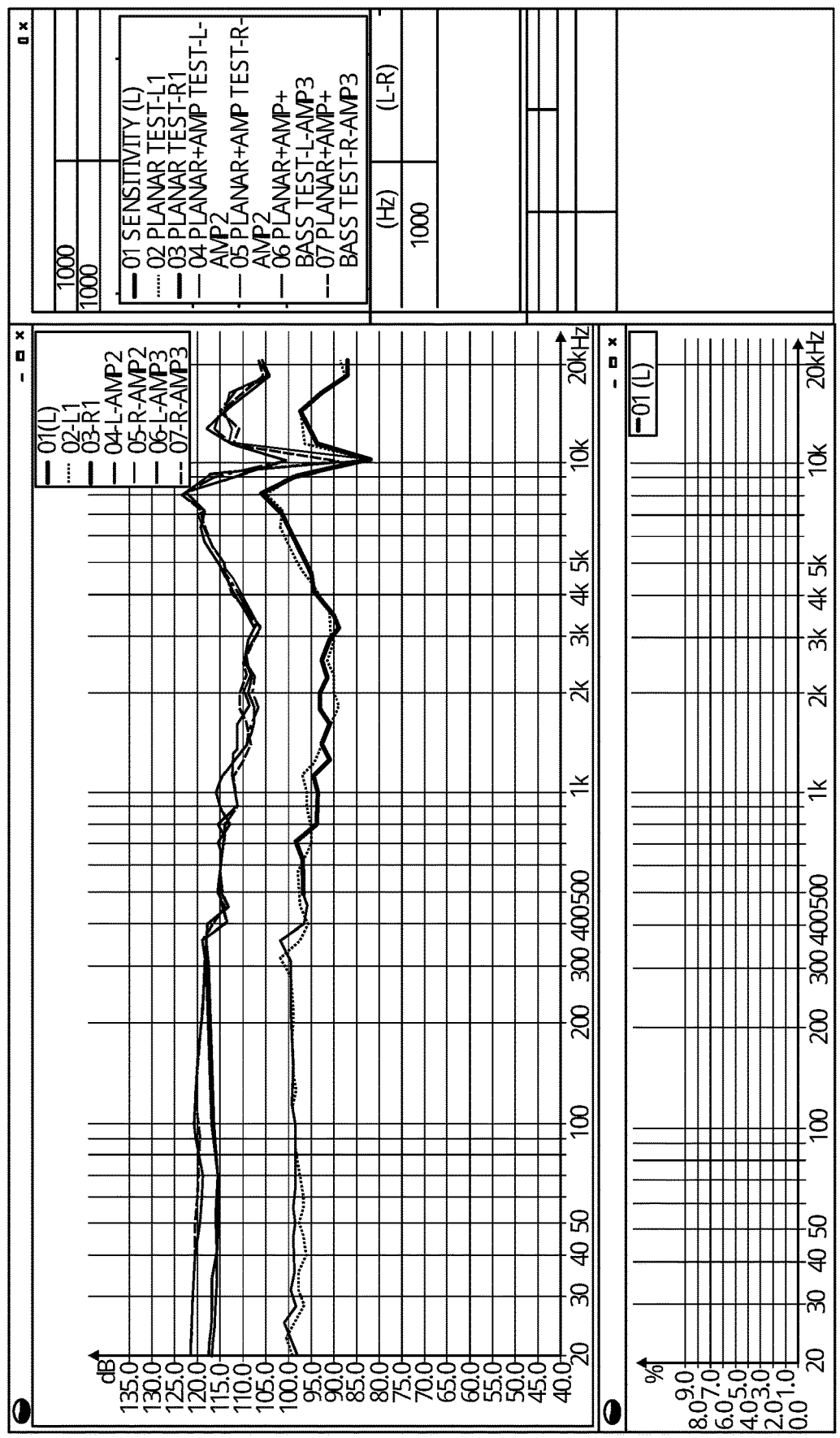
FIG. 9 is a graph showing the linear gain obtained in practical tests with apparatus as taught herein.

Referring now to FIG. 8, this shows a schematic graph of the preferred embodiment of bass boost for the module 64. In the preferred embodiment, the bass boost module 64 has a soft (wide) Q at around 100 Hz, with a faster roll off on the top end so as not to boost any frequencies above 300 Hz and a slower roll off on the lower end with almost as much boost down to 60 Hz and then a slow roll off down to 10 Hz (or 20 Hz) as a lowermost frequency limit. This allows the device 10 to maintain the mid and high end sound curves and only to boost the bass frequencies. At the boost frequencies, bass boost is at a fixed 6 db and is preferably not adjustable.

The design of the amplifier device 60 is particularly suitable for increasing bass for planar headphones having a very flat sound curve. This functionality will work for all headphone types and provide a user with a bigger bass sound profile.

FIG. 8 is a graph showing a series of tests of the amplifier device 10 with the amplification module 62 and bass boost module 64 in their different operating states and demonstrating the linear amplification achievable over the operative frequency range. This, coupled with the feature of lowering the output volume from the sound source (for instance the mobile telephone) and changing volume via the sound source, significantly reduces signal distortion, leading to markedly improved sound quality.

While the preferred embodiment locates the amplifier module in-line in the audio cable between the output of the sound source and the headphones, other embodiments could have a different arrangement. In one example, the headphones are Bluetooth™ enabled, in which case the amplifier module 10 is provided with a Bluetooth™ output unit. In this embodiment, the amplifier module 10 can be in the form of a dongle attachable to the sound source. In another embodiment the amplifier module 10 per se, or even just the boost module thereof, could be incorporated into a set of headphones.

Figure 10:
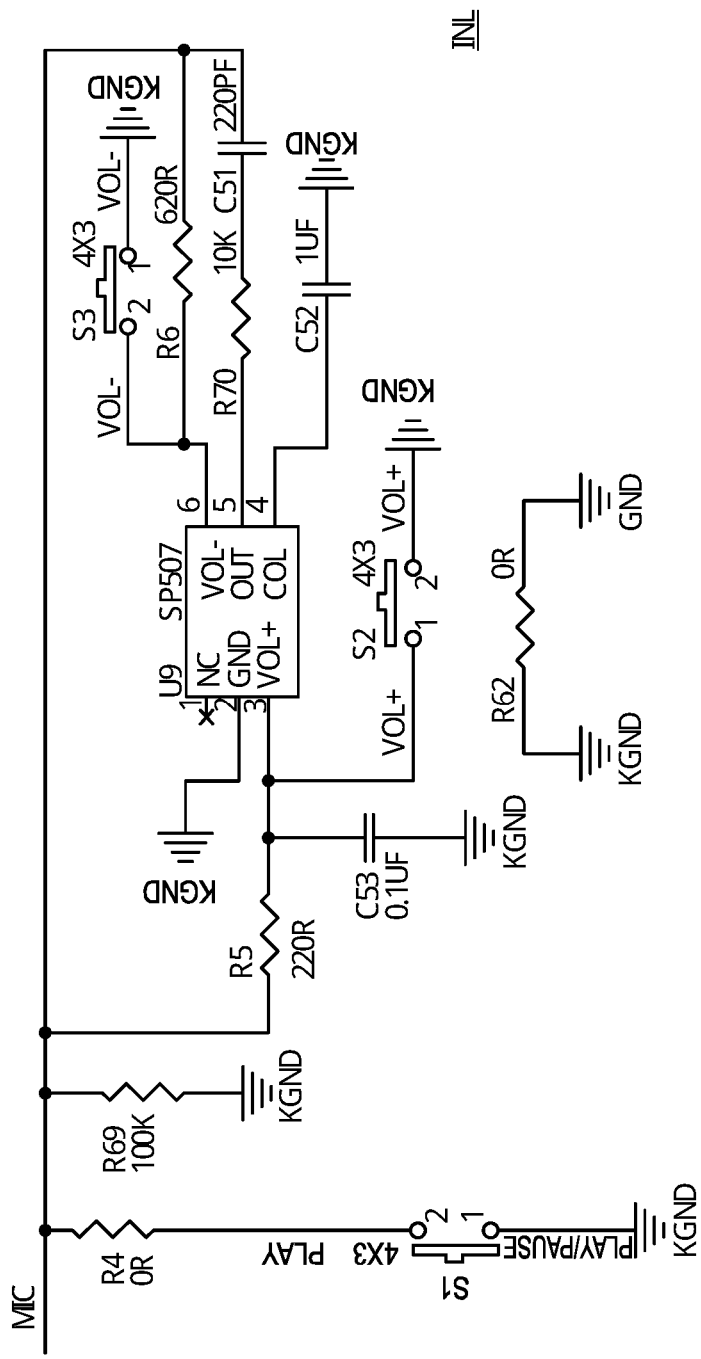
FIG. 10 is a circuit diagram of an embodiment allowing for control of a mobile telephone or the like through the telephone's internal operating system.

It is envisaged that for use with mobile telephones and or electronic tablets, the apparatus may include a module or circuit that allows for volume control via the device's operating system, such as the Apple to allow IOS and the Android operating system. An embodiment of circuit for achieving this is shown in FIG. 10. While FIG. 10 shows the amplifier being connected to a wall outlet, the preferred embodiments uses a battery providing power for 6 to 8 hours.

The embodiment shown utilizes a SP507 Universal wire control chip from ShenZhen Spark Electronics Co., Ltd. designed to support IOS, Android, and Windows control systems. It supports playing/pausing, fast forwarding, rewinding, volume changes to the audio source player through the remote control, selecting the next song, answering and terminating a call, and other functions.

It is also envisaged that the device could be provided with an adapter for the 3.5 mm male plug typically provided for use during air travel. The device can usefully provide high quality audio is a confined environment and from the usually modest audio sources provided on aircraft. In a small seat with little room, the device can provide also volume controls at hand.

On top of incorporating our the amplifier device on the input side and advantageously able to work with Android and IOS MFI type C; it is envisaged the device could comprise an Asic circuit with memory to execute high level App type functions suction as auto equalization, Custom equalization such as Sound ID, which would allow the user to identify best headphone configuration (Sonarworks.com), Integrate spatial enhancements and surround sound digitally similar even possible running Waves "Waves Nx technology for 3D audio, with precision head tracking, virtual room emulation, and 3D sound localization" (Waves.com).

The device may also be adapted to make it more compatible for gaming headphones with already existing volume controllers and use with gaming platforms/computers. This can be achieved by modifying the current bass sound curve to focus on gaming specific super boost, which would enhance gaming experience by highlighting frequencies which make gaming more competitive. The apparatus may also be modified by lengthening the cable and interface with all gaming headset controls. In some embodiments, in gaming mode the volume up and volume down, pause and play functions could be disabled.

In some embodiments, the device would be provided with Wireless inputs in place of the wired 3.5 mm connection, using a BT receiver which would enable such wireless operation. In this implementation Hi Res APTX HD music could be played to any set of wired headphones, and could also be useful for people with impaired hearing, usable also for watching television TV.

It should be appreciated that the embodiments disclosed herein could also be equipped with a noise canceling microphone to the amplifier.

It is also envisaged that the devise could be used for hand held microphones, which need preamps prior to going into a speaker, synthesisers or amplifiers. The amplifier circuit disclosed herein could be configured as a preamp prior to going to a mixer then to a larger amplifier.

Figure 11:
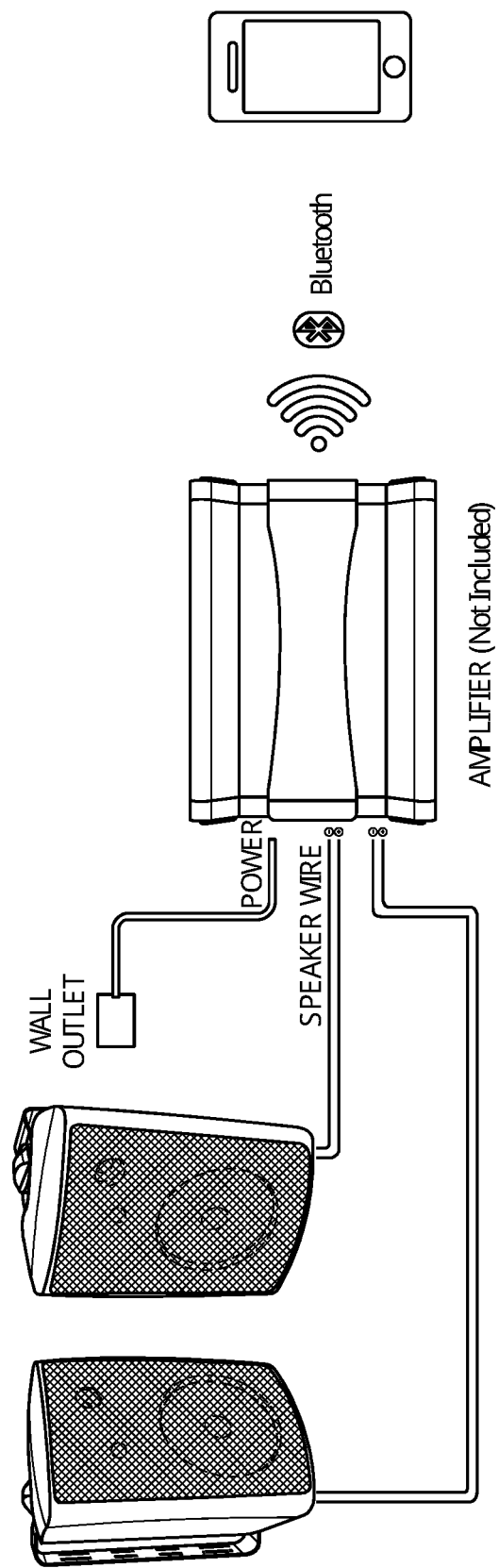
FIG. 11 is an example of a mains powered external speaker arrangement that can benefit for the teachings herein.

The device may also be used with portable speakers to drive mobile amplified or not amplified external speakers. Adding in wireless controlling of volume and pause/play, for example via BT or other wireless protocols and wireless receivers. The advantage is that a user can use inexpensive outdoor speakers and drive them at high volume for larger areas, whether from a wired or a wireless input. Much better sound quality would be achieved in a wired configuration but for wireless transmission APTX HD could be used. FIG. 11 shows an example system that requires a wall outlet, which would not be necessary by use of the amplifier disclosed herein, making it suitable for pool, picnics, beach and sporting events. In practice, the apparatus could employ aa single 3.5 mm outlet and a Y cable to reach each speaker independently.

In some embodiments, the device 10 could include provision for adding spatial effects in addition to further sound design and content, and may also incorporate equalization and/or speech recognition functions. For these embodiments, the device 10 may include a digital to analogue converter and be configured to receive digital input signals, which are then manipulated in the manner(s) described prior to be converted to an analogue signal for processing by the analogue amplifier and boost circuits as described herein.

The device 10 may also be configured to accept digital input signals, such as Apple™ MFI and Type C, and potentially via a USB port or other similar port.

In summary, there is disclosed a sound system which includes a sound source having an analogue audio signal output and a sound volume control; signal amplifier apparatus comprising an analogue signal input configured to be coupled to the analogue audio signal output of the sound source, an analogue signal output and an amplifier module coupled between the signal input and the signal output. The amplifier module has a fixed amplification gain within a range of 10 to 12 decibels. Control of the audio signal is effected solely by the sound volume control of the sound source. The amplifier module also provides a fixed gain bass boost of 6 decibels. The system provides linear amplification and allows a user to reduce the volume of the sound source, which significantly reduces signal distortion. Volume control is at the sound source and not at the amplifier module, which optimises amplification quality and reduces the power requirement of the amplifier apparatus.

The reduction in conversion of the sound signal, in some cases avoided completely and in others to a single conversion from a digital source signal, provides a much cleaner and less distorted system than comparable signals which manipulate digital signals, often by reconverting an analogue output signal back to digital form and then back again to analogue form after manipulation within the amplifier module.

As mentioned above, the applicant has also discovered that the system provides another significant benefit in amplifying a sound signal by means of reducing the source (mobile telephone) volume, namely that distortion coming from the source is reduced and because the amplification is so clean, the sound produced at the headphones has a spatial effect. Specifically, the sound stage is increased and it can create the impression of surround sound. This is an unexpected result. The improved sound signal is particularly advantageous when listening to movies and games, creating a significantly new experience. Tests have identified in particular that the amplifier provides a cleaner, that is less distorted, sound allowing the user to increase the volume at the headphones without fatigue, abrasion or noise, which can also more easily resolve nuances such as echo, reverb, and crowd noise baked into a sound recording. Those cues might be perceived as spatial aspects and a wider sound stage.

The disclosure in the abstract accompanying this application is incorporated herein by reference.

The invention claimed is:

1. A signal amplifier apparatus comprising:
an analogue signal input;
an analogue signal output; and
an amplifier module coupled between the analogue signal input and the analogue signal output;
wherein the amplifier module has a fixed linear amplification gain in a range of 10 to 12 decibels;
wherein the amplifier module is configurable to provide a fixed gain bass boost additive to the fixed linear amplification gain; and
wherein the fixed gain bass boost reduces signal distortions over a predetermined range of bass frequencies; and
wherein the fixed linear amplification gain and/or the fixed gain bass boost are configurable to be on or off and otherwise not adjustable.

2. The signal amplifier apparatus according to claim 1, wherein the amplifier module provides the fixed linear amplification gain of 12 decibels.

3. The apparatus according to claim 1, wherein the fixed gain bass boost is of 6 decibels.

4. The signal amplifier apparatus according to claim 3, wherein the fixed gain bass boost of amplifier module is configured to have a Q at 100 Hz.

5. The signal amplifier apparatus according to claim 4, wherein the predetermined range of bass frequencies is between 60 and 100 Hz.

6. The signal amplifier apparatus according to claim 5, wherein the amplifier module is configured to have the fixed gain bass boost up to a frequency of no more than 300 Hz.

7. The signal amplifier apparatus according to any one of claim 6, wherein the amplifier module is configured to have the fixed gain bass boost that is down to a frequency of no less than one of 10 Hz or 20 Hz.

8. The signal amplifier apparatus according to claim 6, wherein the signal amplifier apparatus is configured to be incorporated into an audio cable having a first connector for coupling to a sound source and a second connector for coupling to one of headphones or earphones.

9. The signal amplifier apparatus according to claim 8, wherein at least one of the first or second connectors is a 3.5 mm connector.

10. The signal amplifier apparatus according to claim 9, further comprising a battery.

11. The signal amplifier apparatus according to claim 10, wherein the battery is a lithium-ion battery.

12. The signal amplifier apparatus according to claim 11, further comprising a charging port that is in the form of a USB-C connector.

13. The signal amplifier apparatus according to claim 8, further comprising a status indicator unit, providing a status indication relating to one or more of: (i) when the signal amplifier apparatus is active, (ii) when the fixed gain bass boost is active, (iii) when the battery is being charged, and (iv) a state of charge of the battery.

14. The signal amplifier apparatus according to claim 13, wherein the status indicator unit is a 3-way LED.

15. The signal amplifier apparatus according to claim 13, further comprising a control input having one or more of: (i) an amplifier off function, (ii) an amplifier on function providing the fixed linear amplification gain, and (iii) a bass boost function providing the fixed gain bass boost.

16. A sound system comprising:
a sound source having an analogue audio signal output for outputting an audio signal and a sound volume control;
a signal amplifier apparatus comprising:
an analogue signal input configured to be coupled to the analogue audio signal output of the sound source;
an analogue signal output;
an amplifier module coupled between the analogue signal input and the analogue signal output;
wherein the amplifier module has a fixed linear amplification gain in a range of 10 to 12 decibels;
wherein the amplifier module is configurable to provide a fixed gain bass boost additive to the fixed linear amplification gain;
wherein the fixed gain bass boost reduces signal distortions over a predetermined range of bass frequencies;
wherein the fixed linear amplification gain and/or the fixed gain bass boost are configurable to be on or off and otherwise not adjustable; and wherein a control of the audio signal is effected solely by the sound volume control of the sound source.

17. A method of amplifying a sound signal from an electronic apparatus comprising
connecting an amplifier module to the electronic apparatus;
wherein the amplifier module has a fixed linear amplification gain in a range of 10 to 12 decibels;
wherein the amplifier module is configurable to provide a fixed gain bass boost additive to the fixed linear amplification gain;
wherein the fixed gain bass boost reduces signal distortions over a predetermined range of bass frequencies; and
wherein the fixed linear amplification gain and/or the fixed gain bass boost are configurable to be on or off and otherwise not adjustable.

18. The method according to claim 17, wherein the fixed gain bass boost of 6 decibels.

19. The method according to claim 18, wherein the fixed gain bass boost has a Q at 100 Hz.

20. The method according to claim 19, wherein the predetermined range of bass frequencies is between 60 Hz and 100 Hz or wherein the amplifier module is configured to have the fixed gain bass boost that is down to a frequency of no less than one of 10 Hz or 20 Hz.

* * * * *